United States Patent
Kerbel

(10) Patent No.: US 8,232,805 B2
(45) Date of Patent: Jul. 31, 2012

(54) BATTERY SENSOR UNIT AND METHOD FOR MANUFACTURING THE BATTERY SENSOR UNIT

(75) Inventor: Sergej Kerbel, Brackenheim (DE)

(73) Assignee: Robert Bosch GmbH, Stuttgart (DE)

( * ) Notice: Subject to any disclaimer, the term of this patent is extended or adjusted under 35 U.S.C. 154(b) by 699 days.

(21) Appl. No.: 12/227,749

(22) PCT Filed: Apr. 27, 2007

(86) PCT No.: PCT/EP2007/054176
§ 371 (c)(1),
(2), (4) Date: Apr. 9, 2009

(87) PCT Pub. No.: WO2008/000537
PCT Pub. Date: Jan. 3, 2008

(65) Prior Publication Data
US 2009/0195252 A1 Aug. 6, 2009

(30) Foreign Application Priority Data
Jun. 26, 2006 (DE) .......................... 10 2006 029 547

(51) Int. Cl.
*G01N 27/416* (2006.01)
*H02J 7/00* (2006.01)
*H02J 7/04* (2006.01)

(52) U.S. Cl. ........ 324/426; 320/132; 320/134; 320/136; 320/152; 320/157

(58) Field of Classification Search .................... 324/426
See application file for complete search history.

(56) References Cited

U.S. PATENT DOCUMENTS
6,832,926 B2* 12/2004 Rudolph et al. .............. 439/345
2008/0233796 A1* 9/2008 Segrt ............................ 439/578

FOREIGN PATENT DOCUMENTS
| DE | 10031243 | | 1/2002 |
| DE | 10031243 A1 | * | 1/2002 |
| DE | 10332410 | | 5/2004 |
| EP | 1435524 | | 7/2004 |

OTHER PUBLICATIONS

International Search Report, PCT International Patent Application No. PCT/EP2007/054176, dated Jul. 24, 2007.

* cited by examiner

*Primary Examiner* — Edward Tso
*Assistant Examiner* — Ahmed Omar
(74) *Attorney, Agent, or Firm* — Kenyon & Kenyon LLP

(57) ABSTRACT

A method is described for manufacturing a battery sensor unit, in particular a battery sensor unit for a motor vehicle battery, comprising a cable holder for a cable end of a cable. The method includes sliding a sleeve composed of a resistor material onto the cable end, at least one first measuring tap being installed between the cable end and an inner circumference of the sleeve. The cable end provided with the sleeve and the measuring tap is inserted into the cable holder and is permanently connected thereto to form a measuring device. A battery sensor unit is described having a fastening device for fastening the battery sensor unit to a contact of a battery, in particular a motor vehicle battery, and having a measuring device for detecting the state of the battery. The measuring device includes a cable end of a cable, a sleeve that is composed of a resistor material and encloses the cable end, at least one first measuring tap, which is installed between an inner circumference of the sleeve and the cable end, and a cable holder which accommodates the sleeve in a permanent connection.

20 Claims, 2 Drawing Sheets

BATTERY SENSOR UNIT AND METHOD FOR MANUFACTURING THE BATTERY SENSOR UNIT

FIELD OF THE INVENTION

The present invention relates to a method for manufacturing a battery sensor unit and to a battery sensor unit having a fastening device and a measuring device.

BACKGROUND INFORMATION

To determine the state of batteries in motor vehicles, the quantities temperature, current, and/or voltage are typically measured and processed using suitable algorithms. A microcontroller or an appropriate arithmetic unit is typically used for this purpose. Measuring shunts and inductive current sensors such as compensation sensors, fluxgate elements, or Hall elements are generally used to measure current.

European Patent Application No. EP-A 1 435 524 describes a battery sensor unit having a fastening device that is attachable directly to a pole of a motor vehicle battery, the fastening device and a battery sensor being combined to form an integrated component. The battery sensor device is adapted to typical battery pole troughs in terms of its size and shape. In addition, the battery sensor is composed of a planar measuring shunt and an electronic unit, the measuring shunt being designed as a resistor element having two resistor terminals designed as mechanical supports.

SUMMARY

An example method according to the present invention for manufacturing a battery sensor unit, in particular a battery sensor unit for a motor vehicle battery, which includes a cable holder for a cable end of a cable, has the advantage that it may result in a manufacturing process that is much simpler than that used to manufacture conventional battery sensor units, thereby also resulting in significant cost reductions. For this purpose, a sleeve composed of a resistor material is slid onto the cable end, at least one first measuring tap being installed between the cable end and an inner circumference of the sleeve. The cable end provided with the sleeve and the measuring tap is then inserted into the cable holder and is permanently connected thereto to form a measuring device. A battery sensor unit is thereby obtained which includes a fastening device for fastening the battery sensor unit to a contact and/or a pole of a battery, in particular a motor vehicle battery, and which includes a measuring device for detecting the state of the battery. The measuring device advantageously includes a cable end of a cable, a sleeve that is composed of a resistor material and encloses the cable end, at least one first measuring tap, which is installed between an inner circumference of the sleeve and the cable end, and a cable holder that accommodates the sleeve in a permanent connection.

In a first example embodiment of the method for manufacturing the battery sensor unit, for example, the at least one first measuring tap is inserted between the cable end and the sleeve after the sleeve has been slid onto the cable end. It is also possible, as an alternative, for the at least one first measuring tap to be placed on the cable end, and for the sleeve to then be slid onto the cable end and the measuring tap. Finally, a further possible manufacturing method results when the at least one first measuring tap is inserted into the sleeve, and then the sleeve and the measuring tap are slid onto the cable end. To this end, it may be advantageous if the at least one first measuring tap includes two legs oriented approximately at right angles to each other, the at least one first measuring tap being attached to the measuring device via the first leg, and the second leg serving to tap a first electrical potential.

To ensure the best possible contact between the cable end, the measuring tap, and the sleeve, it is advantageous when the cable end is stripped along approximately the entire length of the sleeve before the sleeve is slid into place.

A particularly cost-effective, permanent connection between the holder, the sleeve, the measuring tap, and the cable end that, above all, is mass manufacturable, results when the connection is established via pressing, pinching, or crimping. To ensure constancy over a series of the measuring device, and, therefore, to ensure that the measured results obtained regarding the state of the battery are always reproducible, the pressing, pinching, or crimping may be carried out using a defined pressure.

Since the objective is usually to directly measure a voltage drop across the sleeve that is composed of the resistor material and therefore functions as a measuring shunt, it is advantageous when a further measuring tap is installed on the cable holder from the outside. This further measuring tap may be connected to the cable holder, e.g., via soldering, welding, pressing, threading, or bonding. Manganese is preferred for use as the resistor material of which the sleeve is composed. As the at least one first measuring tap, the further measuring tap is also preferably designed to have two legs oriented approximately at right angles to each other, the further measuring tap being attached to the measuring device via the first leg, and the second leg being used for tapping a first electrical potential. In this manner, the voltage drop may be measured via the sleeve using the two measuring taps.

Since most cables have a round cross section, it is advantageous to design the cable holder and the sleeve to be hollow-cylindrical in design, and for the cable end, the sleeve, and cable holder to be located coaxially with one another.

BRIEF DESCRIPTION OF THE DRAWINGS

The present invention is described below with reference to an example shown in FIGS. 1 through 3. Identical components having the same mode of operation are labeled using the same reference numerals. The figures in the drawings, their descriptions, and the claims contain numerous features in combination. Those skilled in the art will also consider the features individually and combine them to form further reasonable combinations. Those skilled in the art will also combine the features of different exemplary embodiments to form further reasonable combinations.

DETAILED DESCRIPTION OF EXAMPLE EMBODIMENTS

Figure 1:
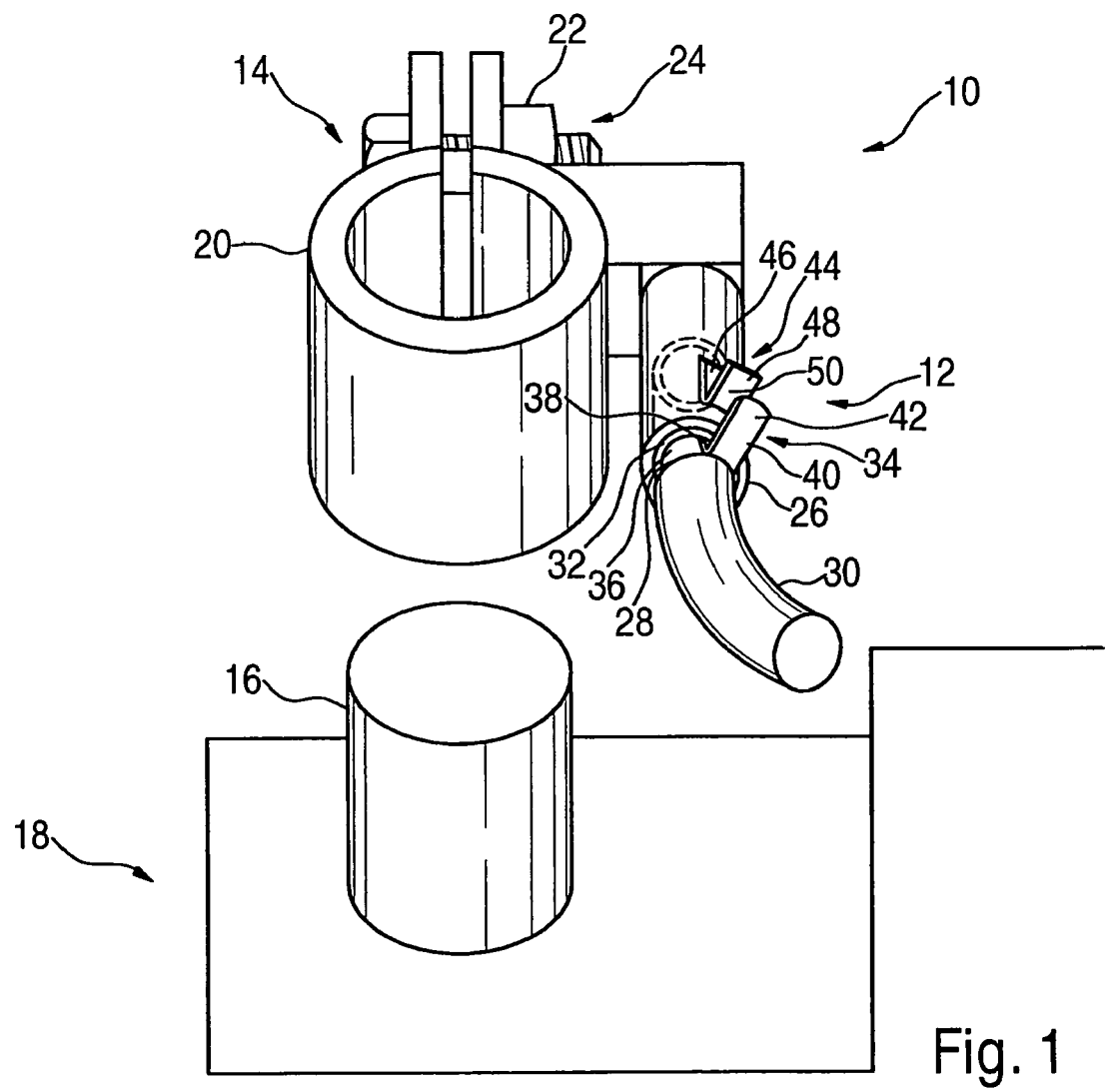
FIG. 1 shows an exemplary embodiment of a battery sensor unit according to the present invention having a measuring device for detecting the state of a motor vehicle battery.

FIG. 1 shows an exemplary embodiment of battery sensor unit 10 according to the present invention having a measuring device 12 and a fastening device 14. Fastening device 14 is used to form a detachable electrical connection between battery sensor unit 10 and a contact 16 and/or pole of a motor vehicle battery 18. To this end, fastening device 14 is connected with the aid of an attachment screw 22—which is designed as a battery terminal 24 and acts on clamping body 20—via contact 16 and/or the pole of battery 18 by slipping fastening device 14 over contact 16 and tightening attachment screw 22 using a suitable tool.

Measuring device 12 of battery sensor unit 10 includes a hollow-cylindrical cable holder 26 for a cable end 28 of a cable 30, in particular a power supply cable, for establishing a permanent connection with an electrical system of the motor vehicle, and serves to detect the state of motor vehicle battery 18. To this end, a hollow-cylindrical sleeve 32 that is composed of a resistor material encloses cable end 28, which is preferably stripped, so that cable end 28, sleeve 32, and cable holder 26 are located coaxially with one another as indicated by the dashed lines. The term "hollow-cylindrical" means that at least one axial end of the hollow cylinder is open. Without limiting the present invention, cable holder 26 and sleeve 32 could also have other shapes, e.g., a cuboid shape or the like. This is advantageous when cable 30 is a flat cable or a cable having another type of cross section.

Figure 2:
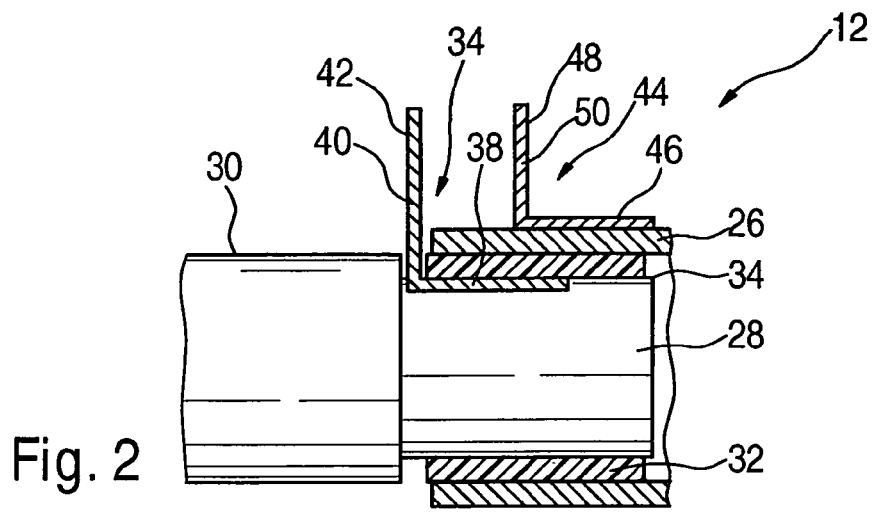
FIG. 2 shows a side view of the assembled measuring device of the example battery sensor unit according to the present invention, as a cross section.

To enable the state of battery 18 to be detected, at least one first measuring tap 34 is installed between an inner circumference 36 of sleeve 32 and cable end 28 (see also FIG. 2). The method for installing at least one first measuring tap 34 will be discussed below with reference to FIG. 3. The at least one first measuring tap 34 includes two legs 38 and 40, which are oriented approximately at right angles to each other, first leg 38 being used as a contact and for attaching first measuring tap 34 to measuring device 12, and second leg 40 being used as connection contact 42 for tapping a first electrical potential. In addition, a further measuring tap 44 is installed on cable holder 26 from the outside, e.g., via soldering, welding, pressing, threading, or bonding. As is the case with the at least one first measuring tap 34, further measuring tap 44 also includes two legs 46, 48, which are oriented approximately at right angles to each other, first leg 46 being used as a contact and for attaching further measuring tap 44 to measuring device 12, while a second electrical potential may be tapped at a terminal contact 48 of second leg 50. The difference between the second electrical potential and the first electrical potential then defines a voltage drop—which results from the flow of the battery current—across sleeve 32, which functions as a measuring shunt, via which the state of battery 18 is detectable using an arithmetic unit (not depicted), e.g., a microcontroller or the like.

Copper or another good conductor is preferred for use as the material for cable holder 12, the at least one first measuring tap 34, further measuring tap 44, and cable 30 (except for its insulation). Manganese may be advantageously used as the resistor material for sleeve 32.

The method for manufacturing the example battery sensor unit 10 will now be described with reference to FIG. 3. For this purpose, sleeve 32, which is composed of the resistor material, is first slid onto cable end 28—which is preferably stripped along approximately the entire length of sleeve 32—in the direction of arrow 52, with the at least one first measuring tap 34 being installed between cable end 28 and inner circumference 36 of sleeve 32. Cable end 28, which is provided with sleeve 32 and measuring tap 34 is then inserted—in the direction of arrow 54—into cable holder 26, and, with it, is permanently connected to measuring device 12. The permanent connection is established via pressing, pinching, or crimping, which is performed on cable holder 26 from the outside with a defined pressure. This defined pressure may be important in order to ensure that the resistance value of measuring device 12 remains constant in mass production. It may also be provided that sleeve 32 includes an axial slot that simplifies the pressing, pinching, or crimping and makes it difficult for cable end 28 to be accidentally pulled out. The slot may extend across the entire length of sleeve 32 or only across a portion thereof, e.g., one half or three-fourths of the length. In the latter case, the slotted end of sleeve 32 preferably points in the direction of cable 30.

In the exemplary embodiment shown, sleeve 32 and cable holder 26 are designed in the shape of hollow cylinders. Cable end 28, sleeve 32, and cable holder 26 are therefore located coaxially with one another. As mentioned above, other embodiments are also possible, depending on the shape of cable 30.

There are various possibilities for installing the at least one first measuring tap 34 between cable end 28 and sleeve 32. For example, the at least one first measuring tap 34 may be slid into place with the aid of a suitable tool, e.g., once sleeve 32 has been slid onto cable end 28. To this end, measuring tap 34 is gripped via its second leg 40, and it is inserted—via its first leg 38, which is oriented at approximately a right angle with the second leg—between cable end 28 and inner circumference 36 of sleeve 32. Cable holder 26 is then pressed, pinched, or crimped, so no further fixing means are required. It is also possible, as an alternative, for the at least one first measuring tap 34 to be placed on cable end 28 via its first leg 38, and for sleeve 32 to then be slid onto cable end 28 and measuring tap 34 and/or its first leg 38. Finally, it is also possible to first insert measuring tap 34 into sleeve 32 via its first leg 38, so that sleeve 32 may then be slid together with measuring tap 34 onto cable end 28.

In the second method, it is not absolutely necessary for cable end 28 to be stripped completely along approximately the entire length of sleeve 32. For example, first leg 38 may include, e.g., contact tips or needles, which, when placed on cable end 28, ensure an electrical contact through the insulation with the copper core of cable 30, in particular after cable holder 26 has been pressed, pinched, or crimped.

Once measuring device 12 has been created via a permanent connection between cable 30, the at least one first measuring tap 34, sleeve 32, and cable holder 26, further measuring tap 44 is installed on cable holder 26 from the outside via its first leg 46. This installation takes place, e.g., via soldering, welding, pressing, threading, bonding, or the like. Second leg 50, which is oriented approximately at a right angle with first leg 46, is then used—as with the at least one first measuring tap 34—to tap a second electrical potential at its connection contact 48.

Figure 3:
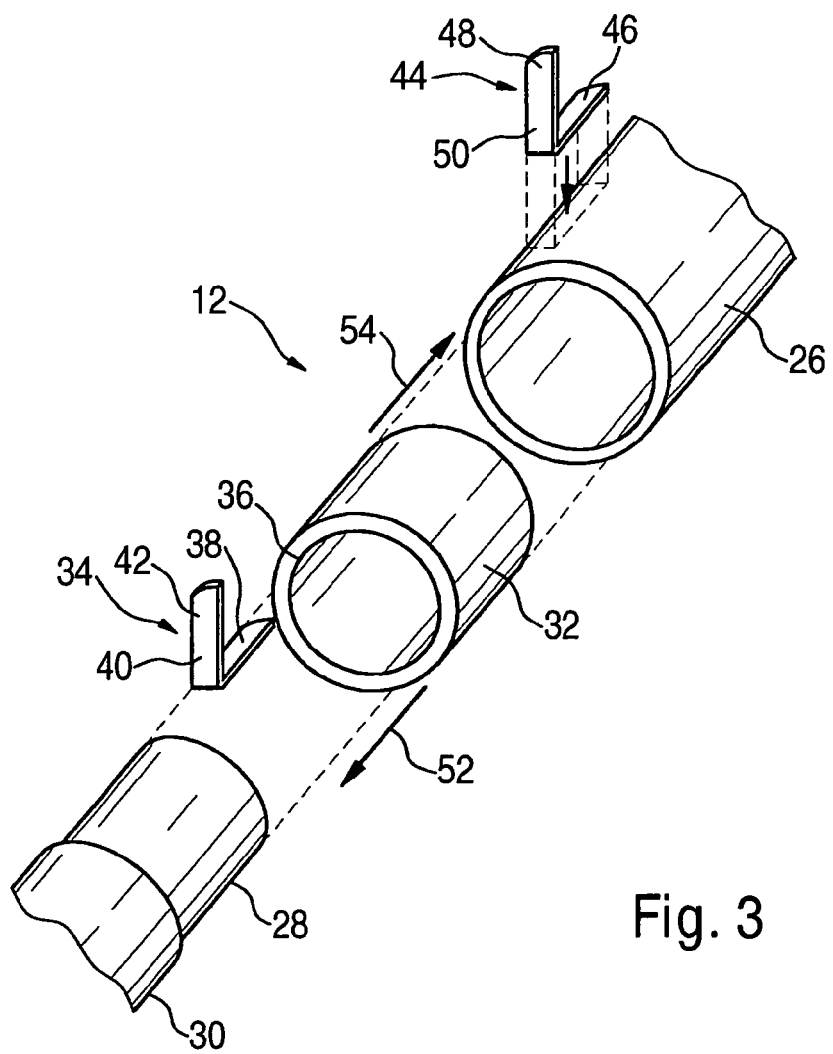
FIG. 3 shows an exploded view of the measuring device of the example battery sensor unit according to the present invention.

Finally, it should also be pointed out that the exemplary embodiment shown is not limited to FIGS. 1 through 3 or to the shapes presented here of measuring taps 34 and 44, or of cable 30, sleeve 32, cable holder 26, measuring device 12, or entire battery sensor unit 10. Measuring taps 34 and 44 in particular may have highly diverse designs. In addition, a conductive material other than copper and a resistor material other than manganese may be used for measuring device 12. In this case, those skilled in the art will make their selection from a wide variety of possible materials.

What is claimed is:

1. A method for manufacturing a battery sensor unit for a motor vehicle battery, comprising:
   sliding a sleeve composed of a resistor material onto a cable end of a cable, at least one first measuring tap being installed between the cable end and an inner circumference of the sleeve;
   inserting the cable end provided with the sleeve and the measuring tap into the cable holder; and
   permanently connecting the cable end to the cable holder to form a measuring device.

2. The method as recited in claim 1, wherein the at least one first measuring tap is inserted between the cable end and the sleeve after the sleeve has been slid onto the cable end.

3. The method as recited in claim 1, wherein the at least one first measuring tap is placed on the cable end, and then the sleeve is slid onto the cable end and the measuring tap.

4. The method as recited in claim 1, wherein the at least one first measuring tap is inserted into the sleeve, and then the sleeve and the measuring tap are slid onto the cable end.

5. The method as recited in claim 1, wherein the at least one first measuring tap has two legs oriented approximately at right angles to each other, the at least one first measuring tap being attached to the measuring device via the first leg, and the second leg being used for tapping a first electrical potential.

6. The method as recited in claim 1, wherein the cable end is stripped over approximately an entire length of the sleeve before the sleeve is slid into place.

7. The method as recited in claim 1, wherein the permanent connection is a pressing, pinching, or crimping.

8. The method as recited in claim 7, wherein the pressing, pinching, or crimping is carried out with a defined pressure.

9. The method as recited in claim 1, wherein a further measuring tap is installed on the cable holder from the outside.

10. The method as recited in claim 9, wherein the further measuring tap is connected to the cable holder via soldering, welding, pressing, threading, or bonding.

11. The method as recited in claim 10, wherein the further measuring tap has two legs oriented approximately at right angles to each other, the further measuring tap being attached to the measuring device via the first leg, and the second leg being used for tapping a second electrical potential.

12. The method as recited in claim 1, wherein the resistor material of the sleeve is manganese.

13. The method as recited in claim 1, wherein the cable holder and the sleeve are designed as hollow cylinders.

14. The method as recited in claim 1, wherein the cable end, the sleeve, and the cable holder are situated coaxially with one another.

15. A battery sensor unit, comprising:
a fastening device adapted to fasten the battery sensor unit to a contact of a battery of a motor vehicle; and
a measuring device adapted to detect the state of the battery, the measuring device including a cable end of a cable, a sleeve that is composed of a resistor material and encloses the cable end, at least one first measuring tap, which is installed between an inner circumference of the sleeve and the cable end, and a cable holder which accommodates the sleeve in a permanent connection.

16. The battery sensor unit as recited in claim 15, wherein the cable holder and the sleeve are designed as hollow cylinders.

17. The battery sensor unit as recited in claim 15, wherein the cable end, the sleeve, and the cable holder are situated coaxially with one another.

18. The battery sensor unit as recited in claim 15, wherein the resistor material of the sleeve is manganese.

19. The battery sensor unit as recited in claim 15, wherein the measuring device includes a further measuring tap installed on the cable holder from the outside.

20. The battery sensor unit as recited in claim 19, wherein the at least one first measuring tap and the further measuring tap each include two legs, which are oriented approximately at right angles to each other, the first legs being used as contacts and for attachment to the measuring device, and the second legs each being used as a connection contact for tapping a voltage drop across the sleeve.

* * * * *